US012364124B2

(12) United States Patent
Yun et al.

(10) Patent No.: US 12,364,124 B2
(45) Date of Patent: Jul. 15, 2025

(54) FLEXIBLE DISPLAY DEVICE

(71) Applicant: LG Display Co., Ltd., Seoul (KR)

(72) Inventors: Junho Yun, Seoul (KR); DongWon Jang, Gumi-si (KR); Lokdam Baek, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 18/610,751

(22) Filed: Mar. 20, 2024

(65) Prior Publication Data

US 2024/0265834 A1     Aug. 8, 2024

Related U.S. Application Data

(63) Continuation of application No. 18/201,181, filed on May 24, 2023, now Pat. No. 11,972,704, which is a
(Continued)

(30) Foreign Application Priority Data

Dec. 27, 2019   (KR) .................. 10-2019-0176663

(51) Int. Cl.
*G09F 9/30*    (2006.01)
*H10K 50/80*   (2023.01)
(Continued)

(52) U.S. Cl.
CPC ........... *H10K 59/131* (2023.02); *G09F 9/301* (2013.01); *H10K 50/8426* (2023.02);
(Continued)

(58) Field of Classification Search
CPC ............. H10K 50/8426; H10K 50/868; H10K 2102/311; H10K 50/85; H10K 59/131;
(Continued)

(56) References Cited

U.S. PATENT DOCUMENTS 10,042,110 B2   8/2018   Park
10,103,179 B2   10/2018  Kwon et al.
(Continued)

FOREIGN PATENT DOCUMENTS

CN   107004698 A   8/2017
CN   107067977 A   8/2017
(Continued)

OTHER PUBLICATIONS

Office Action dated Dec. 22, 2023, issued in corresponding Chinese Patent Application No. 202011425696.4 (partial translation submitted in parent application).
(Continued)

*Primary Examiner* — Kevin Quarterman
(74) *Attorney, Agent, or Firm* — Morgan, Lewis & Bockius LLP

(57) ABSTRACT

A flexible display device may include a cover glass, a light shielding pattern on a lower surface of the cover glass, a display panel under the cover glass and including a display area and a bending area, a plurality of touch sensors disposed at a position corresponding to the display area of the display panel below the cover glass, an adhesive layer between the cover glass and the display panel, a micro coating layer on an upper surface of the display panel in the bending area, a first back plate on a rear surface of the display panel in the display area, and a second back plate.

24 Claims, 10 Drawing Sheets

Related U.S. Application Data continuation of application No. 17/117,642, filed on Dec. 10, 2020, now Pat. No. 11,688,307.

(51) Int. Cl.
  *H10K 50/842* (2023.01)
  *H10K 59/131* (2023.01)
  *H10K 59/80* (2023.01)
  *H10K 102/00* (2023.01)

(52) U.S. Cl.
  CPC ......... *H10K 50/868* (2023.02); *H10K 59/871* (2023.02); *H10K 59/8791* (2023.02); *H10K 2102/311* (2023.02)

(58) Field of Classification Search
  CPC ...... H10K 59/12; H10K 1/0281; H10K 1/147; H10K 2201/10128; H10K 59/00; H10K 50/84; H10K 50/844; H10K 50/86; H10K 77/111; G06F 1/1626; G06F 1/1637; G06F 1/1652; G06F 2203/04102; G02B 1/10; G02B 5/30; G02B 6/005; G09F 9/301; H04M 1/0268; H04M 1/0277; Y02E 10/549
  See application file for complete search history.

(56) References Cited

U.S. PATENT DOCUMENTS

| | | | |
|---|---|---|---|
| 11,688,307 | B2 | 6/2023 | Yun et al. |
| 2016/0172623 | A1 | 6/2016 | Lee |
| 2016/0268546 | A1 | 9/2016 | Lee |
| 2017/0229666 | A1 | 8/2017 | Tsuruoka et al. |
| 2017/0162821 | A1 | 9/2017 | Oh et al. |
| 2017/0338294 | A1 | 11/2017 | Choi et al. |
| 2018/0090702 | A1 | 3/2018 | Um et al. |
| 2018/0097199 | A1 | 4/2018 | Jo et al. |
| 2019/0014669 | A1 | 1/2019 | Ahn et al. |
| 2019/0243501 | A1 | 8/2019 | Lim et al. |
| 2019/0355927 | A1 | 11/2019 | Park |
| 2020/0185641 | A1 | 6/2020 | Jeong et al. |
| 2020/0328375 | A1 | 10/2020 | Won |
| 2021/0126209 | A1 | 4/2021 | Lee et al. |
| 2021/0175462 | A1 | 6/2021 | Shin et al. |
| 2021/0193962 | A1 | 6/2021 | Song et al. |
| 2021/0255367 | A1 | 8/2021 | Kim et al. |

FOREIGN PATENT DOCUMENTS

| | | |
|---|---|---|
| CN | 107425036 A | 12/2017 |
| CN | 109065570 A | 12/2018 |
| KR | 10-2015-0112715 A | 10/2015 |
| KR | 10-2017-0072973 A | 6/2017 |
| KR | 10-2018-0036283 A | 4/2018 |
| KR | 10-2019-0035103 A | 4/2019 |
| WO | 2019/228160 A1 | 12/2019 |

OTHER PUBLICATIONS

First Examination Report dated Dec. 28, 2021, issued in corresponding India Application No. 202014054721.
Office Action dated Nov. 6, 2024 issued in corresponding Korean Patent Application No. 10-2019-0176663.
Combined Search and Examination Report issued in corresponding Great Britain Application No. 2020515.9 dated Jun. 17, 2021.
Office Action dated May 8, 2025, issued in corresponding German Patent Application No. 10 2020 134 206.3.

FLEXIBLE DISPLAY DEVICE

CROSS-REFERENCE TO RELATED APPLICATIONS

This application is a continuation of a co-pending U.S. patent application Ser. No. 18/201,181, filed on May 24, 2023, which is a continuation of U.S. patent application Ser. No. 17/117,642, filed on Dec. 10, 2020, now U.S. Pat. No. 11,688,307, which claims the priority of Republic of Korea Patent Application No. 10-2019-0176663, filed on Dec. 27, 2019, in the Korean Intellectual Property Office. The disclosure of each of the above prior U.S. and Republic of Korea patent applications is incorporated by reference in its entirety.

BACKGROUND

Technical Field

The present disclosure relates to a flexible display device, and more particularly, to a flexible display device capable of reducing bezel width.

Discussion of the Related Art

As the information technology age has entered, the field of display devices that visually display electrical information signals is rapidly developing, and research is being conducted to reduce thickness, weight, and power consumption for various display devices.

Related Art display devices include liquid crystal display devices (LCD), field emission display devices (FED), electro-wetting display devices (EWD), and organic light emitting display devices (OLED).

The electroluminescent display device which is typified by an organic light emitting display device is a self-emissive display device, and unlike a liquid crystal display device, a separate light source is not required, so that it can be manufactured in a lightweight and thin form. In addition, the electroluminescent display device is not only advantageous in terms of power consumption by driving a low voltage, but also has excellent color realization, response speed, viewing angle, and contrast ratio (CR), and is expected to be used in various fields.

In the electroluminescent display device, an emission layer (EML) is disposed between two electrodes made of an anode and a cathode. Holes at the anode are injected into the emission layer and electrons at the cathode are injected into the emission layer. Then, the injected electrons and holes recombine with each other to form excitons in the emission layer, thereby emitting light.

The emission layer includes a host material and a dopant material, and the interaction of the two materials occurs. Accordingly, the host generates excitons from electrons and holes and transfers energy to the dopant. Further, the dopant, is a dye-like organic substance that is added in a small amount, receives energy from a host to convert it to light.

The electroluminescent display device is encapsulated with glass, metal, or film to block the inflow of moisture or oxygen from outside to the inside of the electroluminescent display device, thereby preventing oxidation of the emission layer or electrode and protects it from mechanical or physical impact applied from the outside.

SUMMARY

As the display device is downsized, efforts to reduce the bezel area, which is an outer portion of the display area, continue so as to increase the active display screen size within the same size of the display device.

However, since a wiring, e.g., a signal line, and a driving circuit for driving a display screen are arranged in the bezel area corresponding to the non-display area, there is a limitation in reducing the bezel area.

Recently, there is an effort to reduce the bezel area by bending a non-display area of the flexible substrate in order to reduce the bezel area while securing an area for wiring and a driving circuit with respect to a flexible electroluminescent display device that can maintain display performance even when bended by applying a flexible substrate made of a flexible material such as plastic.

Hereinafter, for convenience, such a display device will be referred to as a bezel bending display device.

Accordingly, the inventors of the present disclosure have recognized the above-mentioned problems and invented a flexible display device having a reduced bezel width.

With an electroluminescent display device using a flexible substrate, such as plastic, it is necessary to secure flexibility such as various insulating layers disposed on the substrate and wirings formed of metal materials and to protect defects, such as cracks that may occur due to bending.

A protective layer, such as a micro coating layer, is disposed over the wiring and the insulating layer in the bending area to suppress cracking of the insulating layer and the wiring disposed in the bending area, and to protect the wiring from foreign matter from outside. In addition, it is coated with a certain thickness and serves to adjust the neutral plane of the bending area.

In the recently developed electroluminescent display device for minimizing the bezel area and thinning the display device, the bending area of the flexible substrate has an extreme curvature radius and the thickness of the micro coating layer is minimized.

In particular, if the bending area of the bezel bending display device has a curvature and is bent (hereinafter referred to as a bezel bending display device having a curvature for convenience), if the adhesiveness of the fixing tape is insufficient, and then peeling may occur in the bending area.

Accordingly, the inventors of the present disclosure invented a flexible display device that implements a bezel bending structure having a curvature without being peeled in the bending area.

The technical problems to be solved in this specification are not limited to the technical problems mentioned above, and other technical problems to be solved will be clearly understood by the skilled person in the art from the following description.

Accordingly, embodiments of the present disclosure are directed to a flexible display device that substantially obviates one or more of the problems due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a flexible display device may comprise a display panel comprising a display area, a non-display area, and a bending area, and an edge bent toward to a rear direction so as to have a particular curvature, a first back plate and a second back plate disposed under the rear surface of the display panel, a Cushion tape disposed under the rear side of the first back plate, and a fixing tape disposed between the cushion tape and the second back plate, wherein the fixing tape is made of an adhesive layer in the bending area.

Specific details of other embodiments are included in the detailed description and drawings.

The flexible display device according to the exemplary embodiment of the present disclosure has an effect of improving the aesthetic sense by reducing the bezel width.

The flexible display device according to the exemplary embodiment of the present disclosure has an effect of improving the quality of the flexible display device by reducing the peeling defect of the bending area.

The effect of the flexible display device according to the exemplary embodiment of the present disclosure is not limited by the contents exemplified above, and more various effects are included in the present disclosure.

Since the technical problems to be solved, the problem-solving means, and the effects described in the specification are not intended to limit the essential features of the claims. Accordingly, the scope of the claims is not limited by the contents described in the specification.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles.

DETAILED DESCRIPTION

Figure 1:
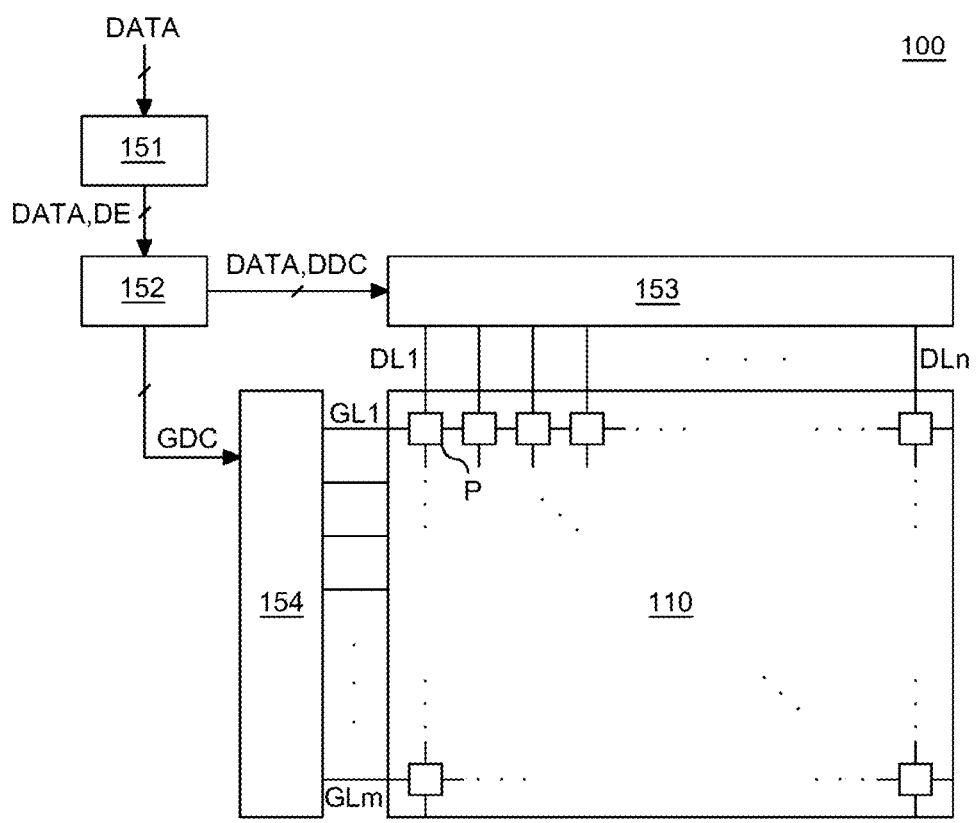
FIG. 1 is a block diagram of a flexible display device according to a first exemplary embodiment of the present disclosure.

Advantages and characteristics of the present disclosure and a method of achieving the advantages and characteristics will be clear by referring to the embodiments described below in detail together with the accompanying drawings. However, the present disclosure is not limited to the embodiment disclosed herein but will be implemented in various forms. The embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other elements to be added unless the terms are used with the term "only". Any references to singular may include plural unless expressly stated otherwise.

Elements are interpreted to include an ordinary error range (e.g., a tolerance range) even if not expressly stated.

When the position relation between two elements is described using the terms such as "on", "above", "under", and "next", one or more elements may be positioned between the two parts unless the terms are used with the term "immediately" or "directly".

When an element or a layer is "on" another element or another layer, it may be interpreted as such the other layer or the other element can be interposed on or in the middle of another element.

Although the terms "first," "second," and the like are used for describing various elements, these elements are not confined by these terms. These terms are merely used for distinguishing one element from the other elements. Therefore, a first element to be mentioned below may be a second element in a technical concept of the present disclosure.

Like reference numerals refer to like elements throughout the specification.

Area and thickness of each element shown in the figures are merely for illustrative purpose for convenience of description, but are not necessarily limited to the area and thickness of the configuration of the present disclosure as illustrated.

Each of the features of the various embodiments of the present disclosure can be combined or combined with each other partly or entirely. The features of the various embodiments can be technically interlocked and driven as well. The features of the various embodiments can be practiced independently of each other or in conjunction with each other.

Hereinafter, various embodiments of the present disclosure will be described in detail with reference to accompanying drawings.

FIG. 1 is a block diagram of a flexible display device according to a first exemplary embodiment of the present disclosure.

Referring to FIG. 1, the flexible display device 100 according to the first exemplary embodiment of the present disclosure may include an image processor 151, a timing controller 152, a data driver 153, and a gate driver 154, and a display panel 110.

The image processor 151 may output a data signal DATA and a data enable signal DE supplied from the outside. The image processor 151 may output one or more of a vertical synchronization signal, a horizontal synchronization signal, and a clock signal in addition to the data enable signal DE.

The timing controller 152 receives a data signal DATA along with a driving signal including a data enable signal DE or a vertical synchronization signal, a horizontal synchronization signal, and a clock signal from the image processor 151. The timing controller 152 can output a gate timing control signal GDC for controlling the operation timing of the gate driver 154 and a data timing control signal DDC for controlling the operation timing of the data driver 153 based on the driving signal.

The data driver 153 can sample and latch the data signal DATA supplied from the timing controller 152 in response to the data timing control signal DDC supplied from the timing controller 152, converts it to a gamma reference voltage, and outputs it. The data driver 153 may output the data signal DATA through the data lines DL1 to DLn.

The gate driver 154 can output a gate signal while shifting the level of the gate voltage in response to the gate timing control signal GDC supplied from the timing controller 152. The gate driver 154 may output a gate signal through the gate lines GL1 to GLm.

The display panel 110 may display an image while the sub-pixel P emits light corresponding to the data signal DATA and the gate signal supplied from the data driver 153 and the gate driver 154. The detailed structure of the sub-pixel P will be described in detail in FIGS. 2, 4A and 4B.

Figure 2:
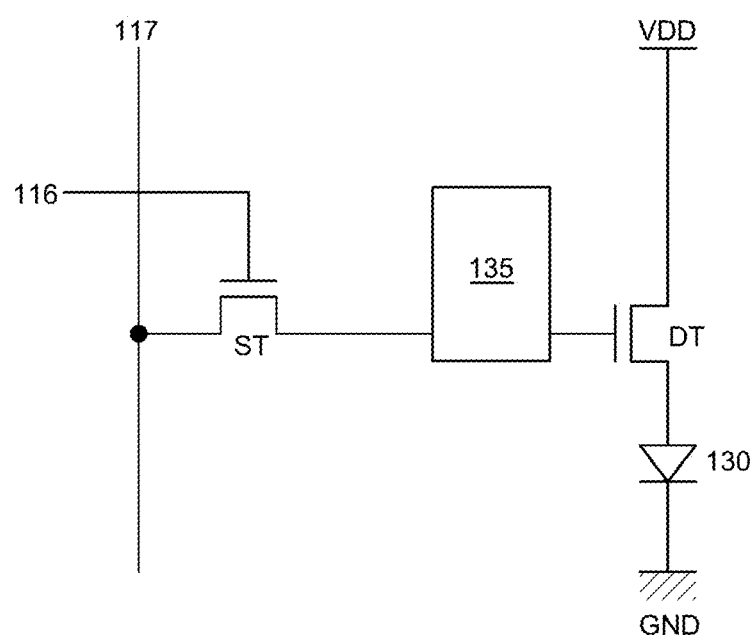
FIG. 2 is a circuit diagram of a sub-pixel included in the flexible display device according to the first exemplary embodiment of the present disclosure.

FIG. 2 is a circuit diagram of a sub-pixel included in the flexible display device according to the first exemplary embodiment of the present disclosure.

Referring to FIG. 2, sub-pixels of the flexible display device 100 according to the first exemplary embodiment of the present disclosure may include a switching transistor ST, a driving transistor DT, a compensation circuit 135, and a light emitting element 130.

The light emitting element 130 may operate to emit light according to the driving current supplied by the driving transistor DT.

The switching transistor ST may perform a switching operation such that the data signal supplied through the data line 117 is stored as a data voltage in a capacitor in response to the gate signal supplied through the gate line 116.

The driving transistor DT may operate such that a constant driving current flows between the high potential power line VDD and the low potential power line GND in response to the data voltage stored in the capacitor.

The compensation circuit 135 is a circuit for compensating for a threshold voltage of the driving transistor DT, and the compensation circuit 135 may include one or more thin film transistors and capacitors. The configuration of the compensation circuit 135 can be very diverse depending on the compensation method.

Although the sub-pixel shown in FIG. 2 is exemplified such that is configured of a 2T (two transistors) and 1C (one capacitor) including a switching transistor ST, a driving transistor DT, a capacitor, and a light emitting element 130. If a compensation circuit 135 is added, the sub-pixel may be variously configured such as 3T1C, 4T2C, 5T2C, 6T1C, 6T2C, 7T1C, and 7T2C.

Figure 3:
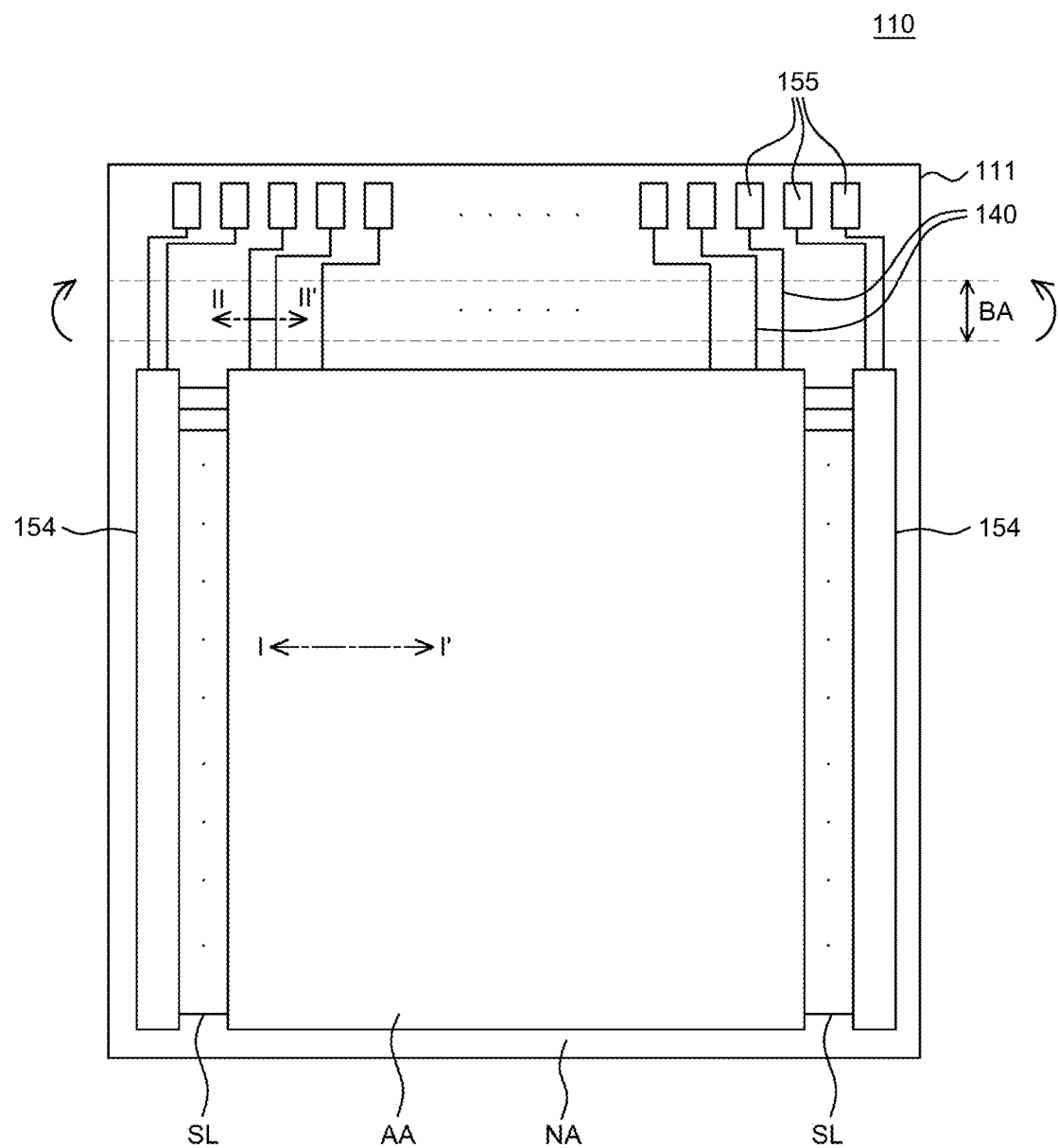
FIG. 3 is a plan view of a display panel of the flexible display device according to the first exemplary embodiment of the present disclosure.

FIG. 3 is a plan view of the display panel 110 of the flexible display device 100 according to the first exemplary embodiment of the present disclosure.

FIG. 3 illustrates, for example, a state in which a flexible substrate 111 of the display panel 110 of the flexible display device 100 according to the first embodiment of the present disclosure is not bent.

Referring to FIG. 3, the display panel 110 may include a display area AA in which pixels that actually emit light and include the thin film transistor and the light emitting element are disposed on the flexible substrate 111 and a non-display area NA which is a bezel area surrounding the edge of the display area AA.

A circuit such as a gate driver 154 for driving the pixels in the display panel 110 of the flexible display device 100 and various signal wires such as a scan line SL may be disposed in the non-display area NA of the display panel 110 of the flexible substrate 100.

The circuit for driving the pixels of the flexible display device 100 may be disposed on the substrate 111 in a GIP (Gate in Panel) method, or may be connected to a flexible carrier in a tape carrier package (TCP) method, or a chip on film (COF) method.

A pad 155 that is a metal pattern is disposed on one side of the substrate 111 in the non-display area NA, so that an external module can be bonded.

A bending area BA may be formed by bending a portion of the non-display area NA of the flexible substrate 111 along the direction arrow.

The non-display area NA of the flexible substrate 111 is an area where wiring and driving circuits for driving a screen are disposed. Since the non-display area NA is not an area where an image is displayed, it is not necessary to be viewed from the upper surface of the flexible substrate 111. Accordingly, the bezel area BA can be reduced by bending the area of the non-display area NA of the flexible substrate 111 but also it can secure an area for wiring and a driving circuit.

Various wirings may be formed on the flexible substrate 111. The wirings may be formed in the display area AA of the substrate 111, or the circuit wiring 140 formed in the non-display area NA may connect a driving circuit or a gate driver, a data driver, and the like to transfer signals.

The circuit wiring 140 is formed of a conductive material, and may be formed of a conductive material having excellent ductility in order to reduce cracking when the substrate 111 is bent. The circuit wiring 140 may be formed of a conductive material having excellent ductility such as gold (Au), silver (Ag), or aluminum (Al), or may be formed of one of various conductive materials used in the display area AA. The circuit wiring 140 may be configured of molybdenum (Mo), chrome (Cr), titanium (Ti), nickel (Ni), neodymium (Nd), copper (Cu), and an alloy of silver (Ag) and magnesium (Mg).

The circuit wiring 140 may be formed of a multi-layered structure including various conductive materials, and may be formed of a three-layer structure of titanium (Ti)/aluminum (Al)/titanium (Ti). However, the present disclosure is not limited thereto.

The circuit wiring 140 formed in the bending area BA is subjected to a tensile force when bending. The circuit wiring 140 extending in the same direction as the bending direction on the flexible substrate 111 receives the greatest tensile force, so that cracking or disconnection may occur. Accordingly, instead of forming the circuit wiring 140 extended in the bending direction, at least a portion of the circuit wiring 140 disposed in the bending area BA, is formed to be extended in a diagonal direction that is a direction different from the bending direction, thereby the tensile force can be minimized.

The circuit wiring 140 disposed in the bending area BA may be formed in various shapes, and may be formed in a trapezoidal wave shape, a triangular wave shape, a sawtooth wave shape, a sinusoidal wave shape, an omega (Ω) shape, a rhombus shape, and the like.

Figure 4A:
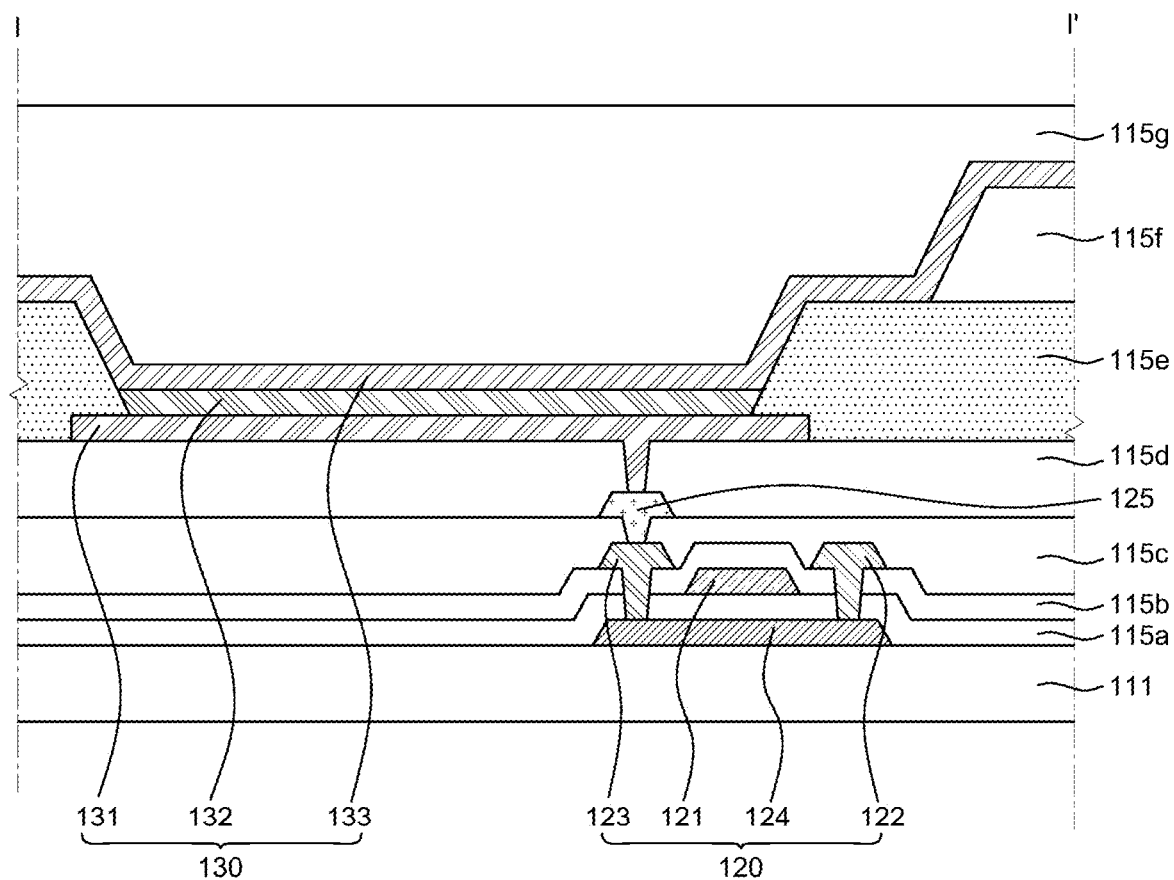
FIG. 4A is a cross-sectional view taken along line I-I' in FIG. 3.

FIG. 4A is a cross-sectional view taken along line I-I' in FIG. 3.

Figure 4B:
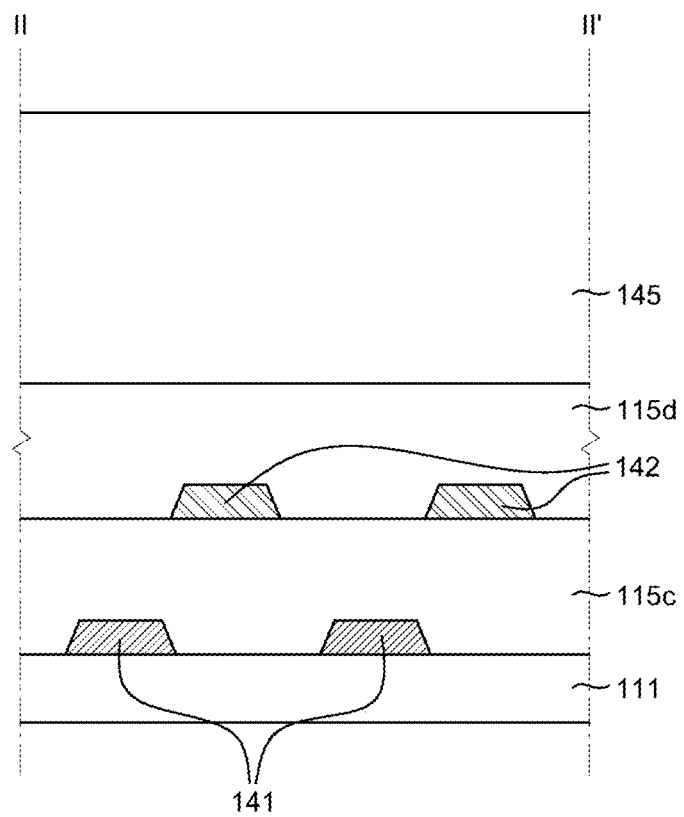
FIG. 4B is a cross-sectional view taken along line II-II' in FIG. 3.

FIG. 4B is a cross-sectional view taken along line II-II' of FIG. 3.

FIG. 4A is a detailed structural cross-sectional view taken along line I-I' of the display area AA in FIG. 3.

Firstly, referring to FIG. 4A, the substrate 111 serves to support and protect elements of the flexible display device 100 disposed thereon.

Recently, a flexible substrate 111 may be used as a soft material having flexible characteristics such as plastic.

The flexible substrate 111 may be in the form of a film including one among the groups of polyester-based polymers, silicone-based polymers, acrylic-based polymers, polyolefin-based polymers, and copolymers thereof.

For example, the flexible substrate 111 may include at least one among polyethylene terephthalate (PET), polybutylene terephthalate (PBT), polysilane, polysiloxane, polysilazane, polycarbosilane, Polyacrylate, polymethacrylate, polymethylacrylate, polymethylmethacrylate, polyethylacrylate, polyethylmethacrylate, cyclic olefin copolymer (COC), cyclic olefin polymer (COP), polyethylene (PE), polypropylene (PP), polyimide (PI), polymethylmethacrylate (PMMA), polystyrene (PS), polyacetal (POM; PolyOxyMethylene), polyetheretherketone (PEEK), polyestersulfone (PES), polytetrafluoroethylene (PTFE), polyvinylchloride (PVC), polycarbonate (PC), Polyvinylidene fluoride (PVDF), perfluoroalkyl polymer (PFA), styrene acrylonitrile copolymer (SAN), and a combination thereof.

A buffer layer may be further disposed on the flexible substrate 111. The buffer layer may suppress penetration of moisture or other impurities from the outside through the flexible substrate 111 and can planarize the surface of the flexible substrate 111. The buffer layer is not necessarily required, and may be excluded depending on the type of the thin film transistor 120 disposed on the flexible substrate 111.

The thin film transistor 120 is disposed on the flexible substrate 111 and may include a gate electrode 121, a source electrode 122, a drain electrode 123 and a semiconductor layer 124.

In this case, the semiconductor layer 124 may be formed of amorphous silicon or polycrystalline silicon. However, the present disclosure is not limited thereto. Polycrystalline silicon has superior mobility than amorphous silicon, and has low energy consumption and excellent reliability, and can be applied to driving thin film transistors of pixels.

The semiconductor layer 124 may be formed of an oxide semiconductor. The oxide semiconductor has excellent mobility and uniformity characteristics. The oxide semiconductor is a quaternary metal-oxide such as an indium-tin-gallium-zinc-oxide (InSnGaZnO) based material, a ternary metal-oxide such as an indium-gallium-zinc-oxide (InGaZnO) based material, an indium-tin-zinc-oxide (InSnZnO) based material, a tin-gallium-zinc-oxide (SnGaZnO) based material, an aluminum-gallium-zinc-oxide (AlGaZnO) based material, an indium-aluminum-zinc-oxide (InAlZnO) based material, a tin-aluminum-zinc-oxide (SnAlZnO) based material, a binary metal-oxide such as indium-zinc-oxide (InZnO) based material, a tin-zinc-Oxide (SnZnO) based material, an aluminum-zinc-oxide (AlZnO) based material, a zinc-magnesium-oxide (ZnMgO) based material, a tin-magnesium-oxide (SnMgO) based material, an indium-magnesium-oxide (InMgO) based material, an indium-gallium-oxide (InGaO) based Materials, an indium-oxide (InO) based materials, a tin-oxide (SnO) based materials, a zinc-oxide (ZnO) based materials, and the like, and the composition ratio of each element is not limited thereto.

The semiconductor layer 124 may include a source region and a drain region doped with a p-type or n-type impurity, and a channel region between the source region and the drain region. A low concentration doped region may be further included between the source region and the drain region adjacent to the channel region.

The source region and the drain region are regions doped with a high concentration of impurities, and the source electrode 122 and the drain electrode 123 of the thin film transistor 120 may be respectively connected.

Impurity ions may be p-type impurities or n-type impurities, and the p-type impurities may be one among boron (B), aluminum (Al), gallium (Ga), and indium (In), and the n-type impurity may be one among phosphorus (P), arsenic (As), and antimony (Sb).

The semiconductor layer 124 may be doped with an n-type impurity or a p-type impurity according to the NMOS or PMOS thin film transistor structure, and a thin film transistor included in the flexible display device 100 according to the first embodiment of the present disclosure can be implemented as the NMOS thin film transistor or the PMOS thin film transistor.

The first insulating layer 115a is an insulating layer made of a single layer of silicon oxide (SiOx) or silicon nitride (SiNx) or multiple layers thereof, and thus, current flowing through the semiconductor layer 124 does not flow to the gate electrode 121. In addition, silicon oxide is less ductile than metal, but is superior in ductility to silicon nitride, and may be formed in a single layer or multiple layers depending on its characteristics.

The gate electrode 121 serves as a switch for turning on or turning off the thin film transistor 120 based on an electric signal transmitted from the outside through the gate line. It may be made of conductive metals such as copper (Cu), aluminum (Al), molybdenum (Mo), chromium (Cr), gold (Au), titanium (Ti), nickel (Ni), neodymium (Nd), and alloys thereof. It may be made of a single layer or multiple layers. However, the present disclosure is not limited thereto.

The source electrode 122 and the drain electrode 123 are connected to a data line, and an electric signal transmitted from the outside may be transmitted from the thin film transistor 120 to the light emitting element 130. The source electrode 122 and the drain electrode 123 may be made of conductive metals such as metal, for example, copper (Cu), aluminum (Al), molybdenum (Mo), chromium (Cr), gold (Au), titanium (Ti), nickel (Ni), neodymium (Nd) and alloys thereof, and may be made of a single layer or multiple layers. However, the present disclosure is not limited thereto.

In order to insulate the gate electrode 121, the source electrode 122, and the drain electrode 123 from each other, the second insulating layer 115b, made of a single layer or multiple layers of silicon oxide (SiOx) or silicon nitride (SiNx), may be disposed between the electrode 121 and the source electrode 122 and the drain electrode 123.

A passivation layer made of an inorganic insulating layer such as silicon oxide (SiOx) or silicon nitride (SiNx) may be further disposed on the thin film transistor 120.

The passivation layer may serve to suppress unnecessary electrical connections between elements disposed above and below the passivation layer and to suppress contamination or damage from the outside, and it may be omitted depending on the characteristics and the configuration of the thin film transistor 120 and the light emitting element 130.

The thin film transistor 120 may be classified into an inverted staggered structure and a coplanar structure according to the arrangement of the elements configuring the thin film transistor 120. For example, a thin film transistor having an inverted staggered structure may have a gate electrode positioned on opposite sides of a source electrode and a drain electrode with respect to a semiconductor layer. Referring to FIG. 4A, the coplanar structured thin film transistor 120 may have the gate electrode 121 on the same side as the source electrode 122 and the drain electrode 123 with respect to the semiconductor layer 124.

Although the thin film transistor 120 having a coplanar structure is illustrated in FIG. 4A, the flexible display device 100 according to the first embodiment of the present disclosure may also include a thin film transistor having an inverted staggered structure.

For convenience of description, only a driving thin film transistor is illustrated among various thin film transistors that may be included in the flexible display device 100, and a switching thin film transistor, a capacitor, and the like may also be included in the flexible display device 100.

In addition, when a signal is applied from the gate line to the switching thin film transistor, the signal from the data line is transferred to the gate electrode of the driving thin film transistor. The driving thin film transistor may transmit the current transmitted through the power supply line to the anode 131 by the signal received from the switching thin film transistor, and control light emission by the current supplied to the anode 131.

The planarization layers 115c and 115d may be disposed on the thin film transistor 120 so as to protect the thin film transistor 120, alleviate the step caused by the thin film transistor 120, and reduce parasitic capacitance generated between the thin film transistor 120, the gate line, the data line, and the light emitting element 130.

The planarization layers 115c and 115d may be made of at least one material among acrylic resin, epoxy resin, phenolic resin, polyamides resin, polyimides resin, and unsaturated polyester resin, polyphenylene resin, polyphenylenesulfides resin, and benzocyclobutene. However, the present disclosure is not limited thereto.

The flexible display device 100 according to the first embodiment of the present disclosure may include a first planarization layer 115c and a second planarization layer 115d sequentially stacked. That is, the first planarization layer 115c may be disposed on the thin film transistor 120 and the second planarization layer 115d may be disposed on the first planarization layer 115c.

A buffer layer may be disposed on the first planarization layer 115c. The buffer layer may be made of multiple layers of silicon oxide (SiOx) to protect elements disposed on the first planarization layer 115c, and may be omitted depending on the configuration and characteristics of the thin film transistor 120 and the light emitting element 130.

The intermediate electrode 125 may be connected to the thin film transistor 120 through a contact hole formed in the first planarization layer 115c. The intermediate electrode 125 is stacked so as to be connected to the thin film transistor 120, and the data line may be formed in a multi-layered structure.

The data line may be formed with a structure in which a lower layer made of the same material as the source electrode 122 and a drain electrode 123 and an upper layer made of the same material as the intermediate electrode 125 are connected. That is, the data line may be implemented in a structure in which two layers are connected in parallel to each other, and in this case, the wiring resistance of the data line may be reduced.

On the other hand, a passivation layer made of an inorganic insulating layer such as silicon oxide (SiOx) or silicon nitride (SiNx) may be further disposed on the first planarization layer 115c and the intermediate electrode 125. The passivation layer may serve to suppress unnecessary electrical connections between elements and to suppress contamination or damage from the outside, and may be omitted depending on the configuration and characteristics of the thin film transistor 120 and the light emitting element 130.

The light emitting element 130 disposed on the second planarization layer 115d may include an anode 131, a light emitting unit 132, and a cathode 133.

The anode 131 may be disposed on the second planarization layer 115d.

The anode 131 is an electrode that serves to supply holes to the light emitting unit 132 and can be electrically connected to the thin film transistor 120 by being connected to the intermediate electrode 125 through a contact hole in the second planarization layer 115d.

The anode 131 may be formed of a transparent conductive material, such as indium tin oxide (ITO), indium zinc oxide (IZO), and the like. However, the present disclosure is not limited thereto.

When the flexible display device 100 is a top-emission that emits light to an upper side where the cathode 133 is disposed, a reflective layer may be further included so as to reflect the emitted light more efficiently from the anode 131 to the upper side.

The anode 131 may be a two-layer structure in which a transparent conductive layer made of a transparent conductive material and a reflective layer are sequentially stacked, or a three-layer structure in which a transparent conductive layer, a reflective layer and a transparent conductive layer are sequentially stacked, and the reflective layer may be silver (Ag) or an alloy including silver.

The bank 115e disposed on the anode 131 and the second planarization layer 115d may define a sub-pixel by separating compartments that actually emits light. The bank 115e may be formed by photolithography after forming a photoresist on the anode 131. Photoresist refers to a photosensitive resin whose solubility in a developer is changed by the action of light, and a specific pattern can be obtained by exposing and developing the photoresist. Photoresists may be classified into positive photoresist and negative photoresist. The positive type photoresist refers to a photoresist whose solubility in a developing solution of an exposed portion is increased by exposure, and when a positive type photoresist is developed, a pattern in which the exposed portion is removed is obtained. Negative photoresist refers to a photoresist whose solubility in the developing solution of the exposed portion is greatly reduced by exposure, and when a negative photoresist is developed, a pattern in which a non-exposed portion is removed is obtained.

A fine metal mask (FMM), which is a deposition mask, may be used to form the light emitting unit 132 of the light emitting element 130.

In addition, in order to suppress damage that may occur due to contact with the deposition mask disposed on the bank 115e, and to maintain a constant distance between the bank 115e and the deposition mask, a spacer 115f configured of one transparent organic material among polyimide, photoacrylic, and benzocyclobutene (BCB), may be disposed on the bank 115e.

A light emitting unit 132 may be disposed between the anode 131 and the cathode 133.

The light emitting unit 132 serves to emit light and may include at least one layer among a hole injection layer (HIL), a hole transport layer (HTL), an emission layer, an electron transport layer (ETL), and an electron injection layer (EIL), and some elements may be omitted depending on the structure or characteristics of the flexible display device 100. Here, it is also possible to apply an electroluminescent layer and an inorganic emitting layer as the emission layer.

The hole injection layer is disposed on the anode 131 to facilitate the injection of holes.

The hole transport layer is disposed on the hole injection layer to efficiently transport holes to the emission layer.

The emission layer is disposed on the hole transport layer and may emit light of a specific color by including a material capable of emitting light of a specific color. In addition, the luminescent material may be formed using a phosphorescent material or a fluorescent material.

An electron injection layer may be further disposed on the electron transport layer. The electron injection layer is an organic layer that facilitates injection of electrons from the cathode 133 and may be omitted depending on the structure and characteristics of the flexible display device 100.

An electron injection layer may be further disposed on the electron transport layer. The electron injection layer is an organic layer that facilitates injection of electrons from the cathode 133 and may be omitted depending on the structure and characteristics of the flexible display device 100.

On the other hand, it is possible to improve the emitting efficiency by suppressing the phenomenon that electrons move from the emission layer when passing through the emission layer to pass into the adjacent hole transport layer or when holes are injected into the emission layer to move from the emission layer to pass through to the adjacent electron transport layer by further disposing an electron blocking layer or a hole blocking layer that blocks the flow of holes or electrons in a position adjacent to the emission layer.

The cathode 133 is disposed on the light emitting unit 132 and serves to supply electrons to the light emitting unit 132. Since the cathode 133 supplies electrons, it may be formed of a metal material such as magnesium (Mg), silver-magnesium (Ag:Mg), which is a conductive material having a low work function. However, the present disclosure is not limited thereto.

When the flexible display device 100 is a top emission type, the cathode 133 may be a transparent conductive oxide such as indium tin oxide (ITO), indium zinc oxide (IZO), indium tin zinc oxide (ITZO), zinc oxide (ZnO), and tin oxide (TO).

On the light emitting element 130, an encapsulation unit 115g may be disposed for protecting the a thin film transistor 120, which is an element of the flexible display device 100, and light emitting element 130 from being oxidized or damaged due to moisture, oxygen, or impurities introduced from the outside, and may be formed by stacking a plurality of encapsulation layers, a foreign material compensation layer, and a plurality of barrier films.

The encapsulation layer may be disposed on the entire upper surface of the thin film transistor 120 and the light emitting element 130, and may be formed of one of inorganic silicon nitride (SiNx) or aluminum oxide (AlyOz). However, the present disclosure is not limited thereto. Additional encapsulation layer may be further disposed on the foreign material compensation layer disposed on the encapsulation layer.

The foreign material compensation layer is disposed on the encapsulation layer, and may be made of an organic material such as silicon oxycarbon (SiOCz), acrylic, or epoxy-based resin. However, the present disclosure is not limited thereto. If a defect occurs due to a crack generated by a foreign material or particles that may be generated during the manufacturing process, the foreign material compensation layer may compensate by covering unevenness and foreign materials.

The barrier film may be disposed on the encapsulation layer and the foreign material compensation layer to delay the penetration of oxygen and moisture from the outside of the flexible display device 100. The barrier film is made of a light-transmissive and double-sided adhesive film, and the barrier film may be further stacked with one material among olefin-based, acrylic-based, and silicon-based insulating materials, or one material among cyclo-olefin polymer (COP), cyclo-olefin copolymer (COC) and polycarbonate (PC). However, the present disclosure is not limited thereto.

FIG. 4B is a detailed structural cross-section II-II' of the bending area BA described in FIG. 3.

Some elements of FIG. 4B are substantially the same and similar to those described in FIG. 4A, and thus, redundant descriptions thereof may be omitted.

The gate signal and the data signal described with reference to FIGS. 1 to 3 are transmitted from the outside to pixels disposed in the display area AA through circuit wiring arranged in the non-display area NA of the flexible display device 100 to emit light.

When the wiring arranged in the non-display area NA including the bending area BA of the flexible display device 100 is formed in a single layer structure, a plenty of space for disposing the wiring is required. After depositing the conductive material, the conductive material is patterned by a process such as etching for forming the shape of the wiring. Since there is a limit to the fineness of the etching process, there is a lot of space due to the limitation to narrow the gap between the wirings. Since plenty of spaces for wirings are required, the area of the non-display area NA becomes large, which may cause difficulty in implementing a narrow bezel.

Further, when one wiring is used to transmit one signal, the corresponding signal may not be transmitted when the wiring is cracked.

In the course of bending the substrate 111, cracks may be generated in the wiring itself, or cracks may be generated in other layers and the cracks may propagate to the wiring. As described above, when a crack occurs in the wiring, a signal to be transmitted may not be transmitted.

Accordingly, the wiring disposed in the bending area BA of the flexible display device 100 according to the exemplary embodiment of the present disclosure may be arranged as double wiring of the first wiring 141 and the second wiring 142.

The first wiring 141 and the second wiring 142 are formed of a conductive material, and may be formed of a conductive material having excellent ductility in order to reduce cracks when bending the flexible substrate 111.

The first wiring 141 and the second wiring 142 may be formed of a conductive material having excellent ductility such as gold (Au), silver (Ag), or aluminum (Al). The first wiring 141 and the second wiring 142 may be formed of one of various conductive materials used in the display area AA, such as molybdenum (Mo), chromium (Cr), titanium (Ti), nickel (Ni), neodymium (Nd), copper (Cu), and an alloy of silver (Ag) and magnesium (Mg). In addition, the first wiring 141 and the second wiring 142 may be formed of a multi-layer structure including various conductive materials, and may be formed of a three-layer structure of titanium (Ti)/aluminum (Al)/titanium (Ti), but is not limited to.

In order to protect the first wiring 141 and the second wiring 142, a buffer layer made of an inorganic insulating layer may be disposed under the first wiring 141 and the second wiring 142, and a passivation layer made of an inorganic insulating layer may be formed to surround the upper and side portions of the first wiring 141 and the second wiring 142. Therefore, a phenomenon such as corrosion of the first wiring 141 and the second wiring 142 by reacting with moisture can be suppressed.

The first wiring 141 and the second wiring 142 formed in the bending area BA may receive a tensile force when bending. As described in FIG. 3, the wiring extending in the same direction as the bending direction on the substrate 111 receives the greatest tensile force. Therefore, cracks may occur and if the crack is severe, disconnection may occur. Accordingly, rather than forming the wiring to extend in the bending direction, at least a portion of the wiring disposed in the bending area BA is formed to be extended in the diagonal direction, which is a direction different from the bending direction, thereby minimizing the tensile force and the possibility of cracks can be reduced. The shape of the wiring may be formed into a rhombus shape, a triangular wave shape, a sinusoidal wave shape, a trapezoidal shape, and the like. However, the present disclosure is not limited thereto.

The first wiring 141 may be disposed on the substrate 111 and the first planarization layer 115c may be disposed on the first wiring 141. The second wiring 142 may be disposed on the first planarization layer 115c, and the second planarization layer 115d may be disposed on the second wiring 142. The first planarization layer 115c and the second planarization layer 115d may be made of at least one material among acrylic resin, epoxy resin, phenolic resin, polyamides resin, polyimides resin, and unsaturated polyester resin, polyphenylene resin, polyphenylenesulfides resin, and benzocyclobutene. However, the present disclosure is not limited thereto.

A micro coating layer (MLC) 145 may be disposed on the second planarization layer 115d.

Since bending may occur due to a tensile force acting on a wiring portion disposed on the substrate 111 at the time of bending, the micro coating layer 145 is provided to protect the wiring by coating a resin with a thin thickness at a bending position.

Figure 5:
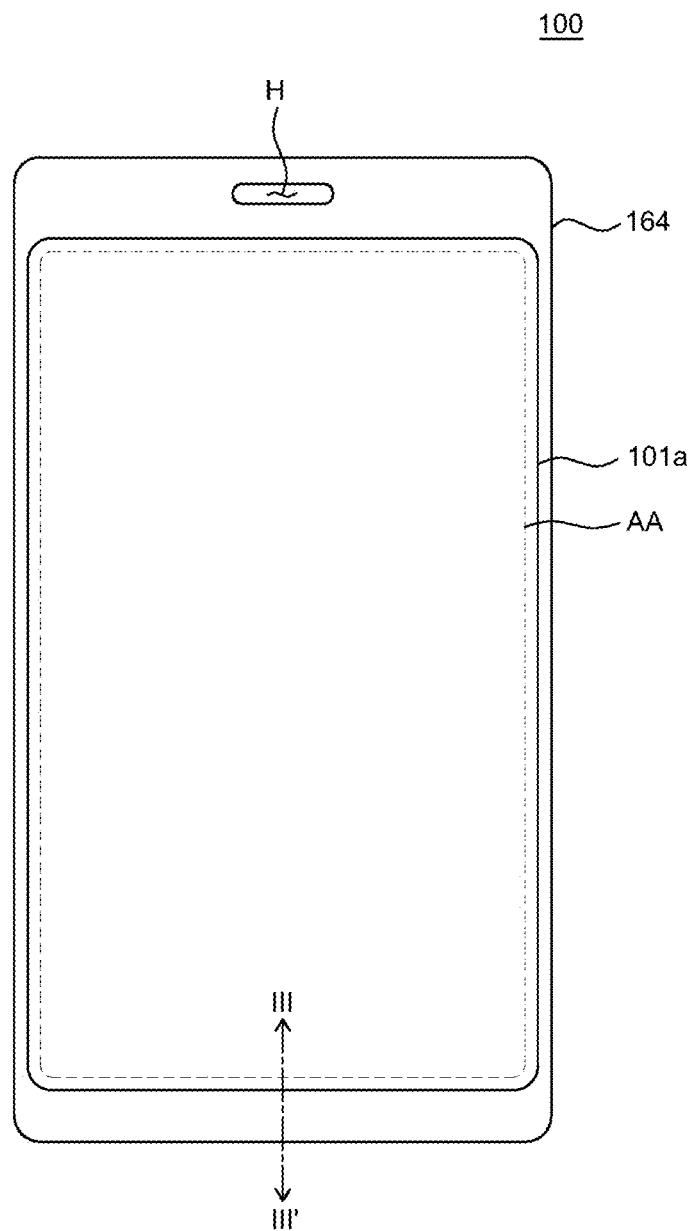
FIG. 5 is a plan view of the flexible display device according to the first exemplary embodiment of the present disclosure.

FIG. 5 is a plan view of the flexible display device according to the first exemplary embodiment of the present disclosure.

Figure 6:
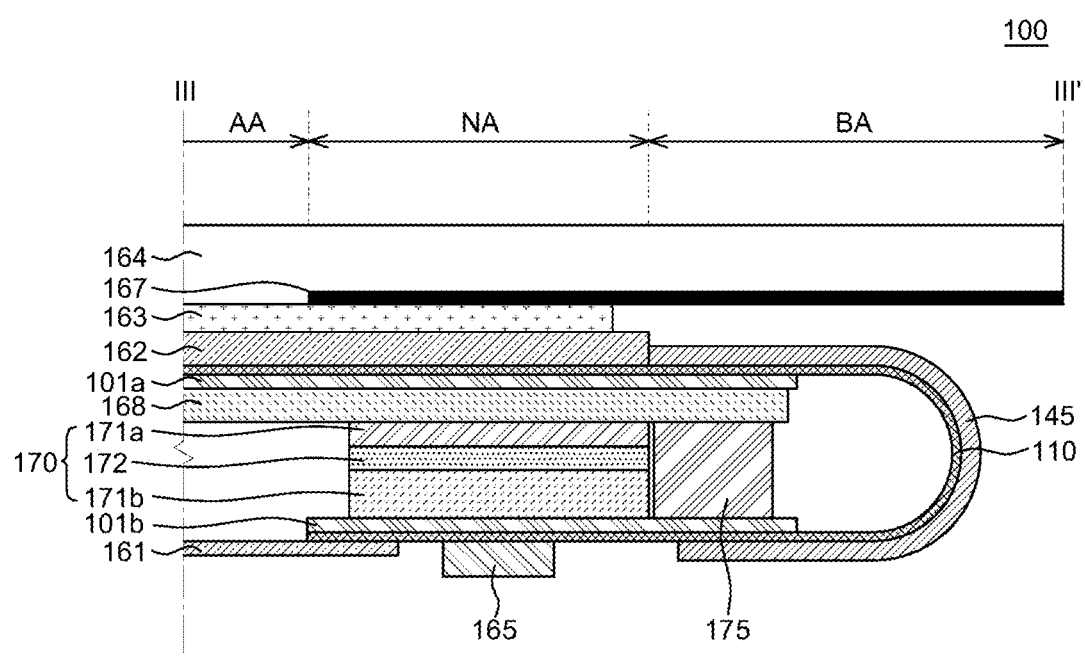
FIG. 6 is a cross-sectional view taken along line III-III' of FIG. 5.

FIG. 6 is a cross-sectional view taken along line III-III' of FIG. 5.

For convenience of explanation, FIGS. 5 and 6 is illustrated with omitted middle frame portion.

FIG. 6 illustrates an example of a cross-section of a lower edge of the flexible display device 100 according to the first embodiment of the present disclosure.

The flexible display device 100 of FIGS. 5 and 6 shows an example in which a hole H for a camera, an optical sensor, a receiver, or a fingerprint sensor is formed on the upper side. However, the present disclosure is not limited thereto and the hole may not be provided thereto.

Referring to FIGS. 5 and 6, the flexible display device 100 according to the first exemplary embodiment of the present disclosure may include a display panel 110, a polarizing plate 162, and a cover glass 164.

The display panel 110 may include a first flat portion, a second flat portion, and a curved portion positioned between the first flat portion and the second flat portion. The first flat portion corresponds to the display area AA having a plurality of sub-pixels and a portion of the non-display area NA, and is an area that maintains a flat shape.

The non-display area NA may be a bezel area surrounding the edge of the display area AA.

The non-display area NA may include a pad unit defined outside the display area AA. A plurality of sub-pixels may be disposed in the display area AA. The sub-pixels may be arranged in the R (red), G (green), B (blue), or R, G, B, W (white) manner in the display area AA to realize full color. The sub-pixels may be arranged by gate lines and data lines intersecting each other.

In addition, the second flat portion is an area facing the first flat portion, corresponds to a pad unit having pads attached to the circuit element 161, and is a region maintaining a flat state.

The circuit element 161 may include bumps or terminals.

The bumps of the circuit element 161 may be respectively bonded to pads of the pad unit through an anisotropic conductive film (ACF). The circuit element 161 may be a chip on film (COF) in which a driving IC (Integrated Circuit) is mounted on a flexible film. Also, the circuit element 161 may be embodied as a COG type that is directly bonded to pads on a substrate by a chip on glass (COG) process. Further, the circuit element 161 may be a flexible circuit such as a flexible flat cable (FFC) or a flexible printed circuit (FPC). In the following embodiments, COF is mainly described as an example of the circuit element 161, but the present disclosure is not limited thereto.

The driving signals supplied through the circuit element 161, for example, a gate signal and a data signal, may be supplied to the gate lines and data lines of the display area AA through circuit wirings such as a routing line.

In the flexible display device 100, sufficient space must be secured for the pad unit and the circuit element 161 to be located in addition to the display area AA in which the input image is displayed. The space corresponds to a bezel area, which is a non-display area NA, and the bezel area can be perceived by a user located on the upper surface of the flexible display device 100, and may be a factor that deteriorates aesthetics of the display device.

Accordingly, the flexible display device 100 according to the first embodiment of the present disclosure may be bent toward a rear surface direction so that the lower edge of the display panel 110 has a predetermined curvature.

The lower edge of the display panel 110 may be the outside of the display area AA, and may correspond to the area where the pad unit is located. As the display panel 110 is bent, the pad unit may be positioned to overlap the non-display area NA in the rear side of the non-display area NA. Accordingly, a bezel area recognized from the upper surface of the flexible display device 100 may be minimized. Accordingly, the bezel width is reduced to provide an effect of improving aesthetics.

To this end, the substrate of the display panel 110 may be made of a flexible material that can be bent. For example, the substrate may be formed of a plastic material such as polyimide (PI). Further, the circuit wiring can be made of a material having flexibility. The circuit wiring may be formed of a material such as metal nano wire, metal mesh, or carbon nanotube (CNT). However, the present disclosure is not limited thereto.

Meanwhile, the curved portion is a bending area BA that maintains a bent state at a predetermined curvature.

At this time, for example, the bending area BA may have a "⊃" shape. That is, the curved portion may extend from the first flat portion and bend 180 degrees to the rear side, and accordingly, the second flat portion extended from the curved portion can be positioned to overlap the first flat portion at the rear surface of the first flat portion. Accordingly, the circuit element 161 bonded to the display panel 110 in the second flat portion may be positioned in a rear direction of the display panel 110 in the first flat portion. However, the present disclosure is not limited thereto, and the bending area BA may have a "⊃" shape and bent downward in a bent state. That is, the curved portion extends from the first flat portion and is bent 180° in the rear direction to have a "⊃" shape, and the entire curved portion of the "⊃" shape has a curvature and may be bent downward.

In addition, although not illustrated, a barrier film may be disposed on the display panel 110.

The barrier film is an element for protecting various elements of the display panel 110 and may be disposed to correspond to at least the display area AA of the display panel 110. The barrier film is not necessarily required, and may be excluded depending on the structure of the flexible display device 100. The barrier film may be made of an adhesive material, and the adhesive material may be a heat-curable or self-curing adhesive, and may be made of a material such as pressure sensitive adhesive (PSA). Accordingly, it may serve to fix the polarizing plate 162 disposed on the barrier film.

The polarizing plate 162 disposed on the barrier film may suppress reflection of external light on the display panel 110. When the flexible display device 100 is used externally, external natural light may flow in and be reflected by the reflective layer included in the anode of the electroluminescent element, or may be reflected by an electrode made of metal disposed under the electroluminescent element. The image of the flexible display device 100 may not be well recognized by the reflected light. The polarizing plate 162 polarizes light introduced from the outside in a specific direction, and prevents reflected light from being emitted to the outside of the flexible display device 100 again.

The polarizing plate 162 disposed on the barrier film may suppress reflection of external light on the display panel 110. When the flexible display device 100 is used outside, external natural light may be introduced and reflected by the reflective layer included in the anode of the electroluminescent element, or may be reflected by an electrode made of metal disposed under the electroluminescent element. The image of the flexible display device 100 may not be well perceived by the reflected light. The polarizing plate 162 polarizes light introduced from the outside in a specific direction, and suppresses the reflected light from being output to the outside of the flexible display device 100.

The polarizing plate 162 may be composed of a polarizer and a protective film protecting the polarizer, or may be formed by coating a polarizing material for flexibility.

A cover glass 164 that protects the screen of the display panel 110 may be adhered to the polarizing plate 162 through an adhesive layer 163. That is, the cover glass 164 is provided to cover the upper surface of the display panel 110 to protect the display panel 110.

The adhesive layer 163 may include optically clear adhesive (OCA).

A light shielding pattern 167 may be formed on four edges of the cover glass 164.

The light shielding pattern 167 may be formed on the rear edge of the cover glass 164.

The light shielding pattern 167 may be formed to overlap a portion of the lower adhesive layer 163, the polarizing plate 162, and the display panel 110.

The light shielding pattern 167 may be applied with black ink.

A touch screen panel may be further provided on the display panel 110. In this case, the polarizing plate 162 may be located on the top of the touch screen panel. When a touch screen panel is included, the cover glass 164 may be provided to cover at least a part of the touch screen panel.

The touch screen panel includes a plurality of touch sensors. The touch sensor may be disposed at a position corresponding to the display area AA of the display panel 110. The touch sensor may include at least one mutual-capacitance sensor and a self-capacitance sensor.

The mutual-capacitance sensor includes a mutual capacitance formed between two touch electrodes. The mutual capacitance sensing circuit may apply a driving signal or a stimulus signal to either of the two electrodes and sense a touch input based on the amount of change in the mutual-capacitance through the other electrode. When a conductor approaches the mutual-capacitance, the amount of charge in the mutual-capacitance decreases, so that a touch input or a gesture can be detected.

The self-capacitance sensor includes a self-capacitance formed on each of the sensor electrodes. The self-capacitance sensing circuit can supply a charge to each sensor electrode and sense a touch input based on a change in the charge of the self-capacitance. When a conductor approaches the self-capacitance, the capacitance of the sensor is connected in parallel to the capacitance of the sensor, thereby increasing the capacitance value. Therefore, in the case of a self-capacitance, when the touch input is sensed, the capacitance value of the sensor increases.

A plurality of holes H or openings may be provided on the flexible display device 100. For example, the hole H may include an optical sensor hole, a receiver hole, a camera hole, and a fingerprint sensor hole or home-button hole.

Back plate 101a and 101b may be disposed on the rear surface of the display panel 110. When the substrate of the display panel 110 is made of a plastic material such as polyimide, the manufacturing process of the flexible display device 100 proceeds in a situation in which a supporting substrate made of glass is disposed on the rear surface of the display panel 110. After the manufacturing process is completed, the supporting substrate may be separated and released.

Since an element for supporting the display panel 110 is required even after the supporting substrate is released, back plate 101a and 101b for supporting the display panel 110 may be disposed on the rear surface of the display panel 110 except for a portion of the bending area BA.

The back plate 101a and 101b may suppress foreign matters from being attached to the lower portion of the substrate, and may serve to reduce shocks from the outside.

At this time, the back plate 101a and 101b may be made of a first back plate 101a and the second back plate 101b positioned on each of the rear surface of the first flat portion and the second flat portion. The first back plate 101a reinforces the rigidity of the first flat portion, so that the first flat portion can maintain a flat state. The second back plate 101b reinforces the rigidity of the second flat portion, so that the second flat portion can maintain a flat state. On the other hand, in order to secure the flexibility of the curved portion and to facilitate the control of the neutral plane using the micro coating layer 145, it is preferable that the back plate 101a and 101b are not located on a portion of the rear side of the curved portion.

The back plate 101a and 101b may be formed of a plastic thin film formed of polyimide (PI), polyethylene naphthalate (PEN), polyethylene terephthalate (PET), polymers, combinations of polymers thereof, and the like.

A cushion tape 168 may be disposed on the rear surface of the first back plate 101a.

The cushion tape 168 may be attached to the rear surface of the first back plate 101a using an adhesive. The cushion tape 168 may be disposed away by a predetermined distance from the end of the first back plate 101a. However, the present disclosure is not limited thereto.

The adhesive may have an embossing pattern.

The adhesive may be made of pressure sensitive adhesive (PSA).

The cushion tape 168 may be compressed when receiving external force to absorb shock.

The cushion tape 168 may include a heat dissipation sheet on the rear surface.

The heat dissipation sheet may function to protect heat dissipation, electrical grounding, and rear surface.

The heat dissipation sheet may be composed of a composite heat dissipation sheet.

Fixing tape 170 and 175 may be attached to the rear surface of the cushion tape 168. The fixing tape 170 and 175 may be separated into two at the boundary between the non-display area NA and the bending area BA. However, the present disclosure is not limited thereto.

For example, the fixing tape 170 and 175 in the flexible display device according to the first embodiment of the present disclosure may include the first fixing tape 170 attached to the rear surface of the cushion tape 168 in the non-display area NA and the second fixing tape 175 attached to the rear surface of the cushion tape 168 of the bending area BA. However, the present disclosure is not limited thereto.

The first fixing tape 170 and the second fixing tape 175 may be separated from each other at the boundary between the non-display area NA and the bending area BA. However, the present disclosure is not limited thereto.

The first fixing tape 170 and the second fixing tape 175 may have the same thickness. However, the present disclosure is not limited thereto.

The first fixing tape 170 may be disposed between the cushion tape 168 of the non-display area NA and the second back plate 101b. In addition, the second fixing tape 175 may be disposed between the cushion tape 168 of the bending area BA and the second back plate 101b.

The edge of first fixing tape 170 and the edge of the polarizing plate 162 disposed on the first fixing tape 170 may be aligned each other. However, the present disclosure is not limited thereto.

The first fixing tape 170 may be configured of the first adhesive layer 171a attached to the rear surface of the cushion tape 168, the second adhesive layer 171b attached to the upper surface of the second back plate 101b, and the electromagnetic wave absorbing layer 172 disposed between the first adhesive layer 171a and the second adhesive layer 171b. On the other hand, the second fixing tape 175 may be made of only an adhesive layer.

As described above, the flexible display device 100 according to the first embodiment of the present disclosure is configured such that the fixing tape 170 and 175 is separated into the first fixing tape 170 and the second fixing tape 175 to suppress lifting in the bending area BA and the bending area BA is characterized in that the second fixing tape 175 is formed of only an adhesive layer having a sufficient thickness.

That is, the electromagnetic wave absorbing layer 172 is applied to the first fixing tape 170 to shield the electromagnetic interference (EMI) of the driving IC 165, and due to the application of the electromagnetic wave absorbing layer 172, a limitation occurs in the thicknesses of the first and second adhesive layers 171a and 171b. In this case, a problem may be caused in response to a peeling issue in the bending area BA. In particular, in the case of a bezel bending structure having a curvature, if the adhesive force of the first fixing tape 170 is insufficient, peeling may occur in the bending area BA.

Accordingly, the present disclosure is characterized by providing a flexible display device 100 capable of implementing a bezel bending structure having a curvature without peeling in the bending area BA.

To this end, the fixing tape 170 and 175 may be separated into two of the first fixing tape 170 and the second fixing tape 175 at the boundary between the non-display area NA and the bending area BA. That is, for example, the fixing tape 170 and 175 in the flexible display device according to the first embodiment of the present disclosure may include the first fixing tape 170 attached to the rear surface of the cushion tape 168 in the non-display area NA and the second fixing tape 175 attached to the rear surface of the cushion tape 168 of the bending area BA, but, is not limited thereto.

That is, for example, a first fixing tape 170 provided with an electromagnetic wave absorbing layer 172 can be applied to the first and second flat portions of the display panel 110 maintaining a flat state and a second fixing tape 175 made of only an adhesive layer other than the electromagnetic wave absorbing layer can be applied to the curved surface portion having a curvature, which is the bending area BA. Accordingly, in the bending area BA, the peeling defect can be suppressed by increasing the thickness of the adhesive layer.

Meanwhile, a micro coating layer 145 may be disposed on the bending area BA of the display panel 110. The micro coating layer 145 may be formed to cover one side of the barrier film.

Since the micro coating layer 145 may be cracked due to a tensile force acting on the circuit wiring disposed on the display panel 110 during bending, a resin is formed in a thin thickness at a bending position, thereby protecting the wirings.

The micro coating layer 145 may be made of an acrylic material, such as an acrylate polymer, but is not limited thereto.

The micro coating layer 145 may control a neutral plane of the bending area BA.

As described above, when the structure is bent, the neutral plane may be referred to as a virtual plane that is not stressed because the compressive force and the tensile force applied to the structure cancel each other out. When two or more structures are stacked, a virtual neutral plane may be formed between the structures. When the entire structure is bent in one direction, structures disposed in the bending direction from the neutral plane are compressed by bending, and thus receive a compressive force. On the contrary, structures arranged in the opposite direction to the bending direction from the neutral plane are stretched by bending, and thus are subjected to tensile force. In addition, since structures are more vulnerable when subjected to tensile force among the same compressive force and tensile force, the probability of cracking is higher when subjected to tensile force.

The flexible substrate of the display panel 110 disposed on the lower portion from the neutral plane is compressed, so it receives a compressive force, and circuit wires disposed on the upper portion from the neutral plane can receive a tensile force, and cracks may be generated by the tensile force. Therefore, the circuit wiring can be placed on the neutral plane in order to minimize the tensile force received by the circuit wiring.

By arranging the micro coating layer 145 in the bending area BA, the neutral plane can be shifted to the upper portion so that the neutral plane is formed at the same level as the circuit wiring or is positioned higher than the circuit wiring, and thus the circuit wiring does not receive tensile stress or receive compressive stress when bending, thereby suppressing the occurrence of cracks.

The circuit element 161 may be connected to the end of the second flat portion of the display panel 110.

Various wirings for transmitting signals to the pixels disposed in the display area AA may be formed on the circuit element 161.

The circuit element 161 may be formed of a material having flexibility to bend.

A driving IC 165 may be mounted on the second flat portion of the display panel 110 and connected to a wiring formed on the circuit element 161 to provide driving signals and data to the sub-pixels disposed in the display area AA.

The circuit element 161 may be a flexible printed circuit board (FPCB).

The micro coating layer 145 of the flexible display device of the first embodiment of the present disclosure may be formed to cover one side of the barrier film on the bending area BA of the display panel 110, and additionally, in order to further suppress the occurrence of cracks, the micro coating layer 145 may be extended to cover a portion of the side and top surfaces of the polarizing plate 162, which will be described in detail through the second embodiment of the present disclosure.

Figure 7:
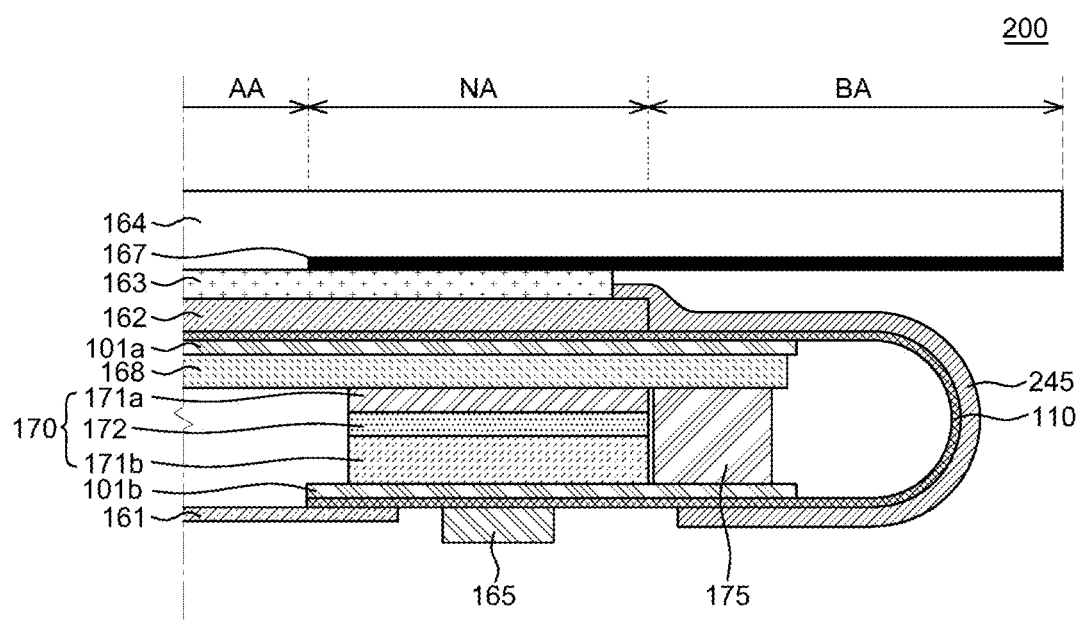
FIG. 7 is a cross-sectional view of a flexible display device according to a second exemplary embodiment of the present disclosure.

FIG. 7 is a cross-sectional view of a flexible display device according to a second exemplary embodiment of the present disclosure.

FIG. 7 illustrates an example of a cross-section of the lower edge of the flexible display device 200 according to the second exemplary embodiment of the present disclosure.

The flexible display device 200 according to the second embodiment of the present disclosure as illustrated in FIG. 7 is substantially the same configuration as the flexible display device 100 according to the first embodiment of the present disclosure as illustrated in FIG. 6 except for the micro coating layer 245. Therefore, the same reference numerals will be used for the same configuration.

Referring to FIG. 7, the flexible display device 200 according to the second exemplary embodiment of the present disclosure may include a display panel 110, a polarizing plate 162, and a cover glass 164.

The display panel 110 may include a first flat portion, a second flat portion, and a curved portion positioned between the first flat portion and the second flat portion. The first flat portion corresponds to the display area AA having a plurality of sub-pixels and a portion of the non-display area NA, and is an area that maintains a flat state.

In addition, the second flat portion is an area facing the first flat portion, and is a region corresponding to a pad unit having pads joined to the circuit element 161 and maintaining a flat state.

Substantially the same as the first embodiment of the present disclosure described above, the flexible display device 200 according to the second exemplary embodiment of the present disclosure may be bent in a rear surface direction so that the lower edge of the display panel 110 has a predetermined curvature.

Meanwhile, the curved portion is a bending area BA that maintains a bent state at a predetermined curvature.

At this time, for example, the bending area BA may have a " ⊃ " shape. That is, the curved portion may extend from the first flat portion and bend 180 degrees in the rear direction, and accordingly, the second flat portion extending from the curved portion can be positioned to overlap the first flat portion at the rear surface of the first flat portion. Accordingly, the circuit element 161 bonded to the display panel 110 in the second flat portion may be positioned in a rear direction of the display panel 110 of the first flat portion. However, the present disclosure is not limited thereto, and the bending area BA may have a " ⊃ " shape and bent downward in a bent state. That is, the curved portion extends from the first flat portion and is bent 180° in the rear direction to have a " ⊃ " shape, and the entire curved portion of the " ⊃ " shape has a curvature and may be bent downward.

In addition, although not illustrated, a barrier film may be disposed on the display panel 110.

A polarizing plate 162 may be disposed on the barrier film.

A cover glass 164 may be disposed on the polarizing plate 162 through an adhesive layer 163.

A light shielding pattern 167 may be formed on four edges of the cover glass 164.

Back plate 101a and 101b may be disposed on the rear surface of the display panel 110.

At this time, the back plate 101a and 101b may be configured of the first back plate 101a and the second back plate 101b located on each of the rear surface of the first flat portion and the second flat portion.

A cushion tape 168 may be disposed on the rear surface of the first back plate 101a.

The cushion tape 168 may be attached to the rear surface of the first back plate 101a using an adhesive. The cushion tape 168 may be disposed away from a predetermined distance from the edge of the first back plate 101a. However, the present disclosure is not limited thereto.

Fixing tape 170 and 175 may be attached to the rear surface of the cushion tape 168. The fixing tape 170 and 175 may be separated into two at the boundary between the non-display area NA and the bending area BA. However, the present disclosure is not limited thereto.

For example, the fixing tape 170 and 175 according to the second embodiment of the present disclosure may include a first fixing tape 170 attached to the rear surface of the cushion tape 168 in the non-display area NA and a second fixing tape 175 attached to the rear surface of the cushion tape 168 in the bending area BA. However, the present disclosure is not limited thereto.

The first fixing tape 170 and the second fixing tape 175 may be separated from each other at the boundary between the non-display area NA and the bending area BA. However, the present disclosure is not limited thereto.

The first fixing tape 170 and the second fixing tape 175 may have the same thickness. However, the present disclosure is not limited thereto.

The first fixing tape 170 may be disposed between the cushion tape 168 of the non-display area NA and the second back plate 101b. In addition, the second fixing tape 175 may be disposed between the cushion tape 168 of the bending area BA and the second back plate 101b.

The first fixing tape 170 may be disposed such that the edges thereof aligned with the upper polarizing plate 162. However, the present disclosure is not limited thereto.

The first fixing tape 170 may include a first adhesive layer 171a attached to the rear surface of the cushion tape 168, a second adhesive layer 171b attached to the second back plate 101b, and an electromagnetic wave absorption layer 172 disposed between the first adhesive layer 171a and the second adhesive layer 171a. On the other hand, the second fixing tape 175 may be made of only an adhesive layer.

As described above, the flexible display device 100 according to the second exemplary embodiment of the present disclosure is configured such that the fixing tape 170 and 175 is separated into the first fixing tape 170 and the second fixing tape 175 to suppress peeling in the bending area BA and the second fixing tape 175 is made of only an adhesive layer of sufficient thickness in the bending area BA.

Meanwhile, a micro coating layer 245 may be disposed on the bending area BA of the display panel 110. The micro coating layer 245 may be extended to cover one side and a portion of the top surface of the polarizing plate 162. The micro coating layer 245 may be extended to the side of the adhesive layer 163. However, the present disclosure is not limited thereto.

The micro coating layer 245 may be made of an acrylic-based material such as an acrylate polymer. However, the present disclosure is not limited thereto.

The micro coating layer 245 may adjust the neutral plane of the bending area BA.

The circuit element 161 may be connected to the edge of the second flat portion of the display panel 110.

Various wirings for transmitting signals to the pixels disposed in the display area AA may be formed on the circuit element 161.

A driving IC 165 may be mounted on the second flat portion of the display panel 110 and connected to a wiring formed on the circuit element 161 so as to provide driving signals and data to sub-pixels disposed in the display area AA.

Meanwhile, the fixing tape 170 and 175 of the flexible display devices of the first and second embodiments of the present disclosure may be divided into two, the first fixing tape 170 and the second fixing tape 175. However, the present disclosure is not limited thereto and it may be configured as an integrated fixing tape 370. This will be described in detail through the third embodiment of the present disclosure.

Figure 8:
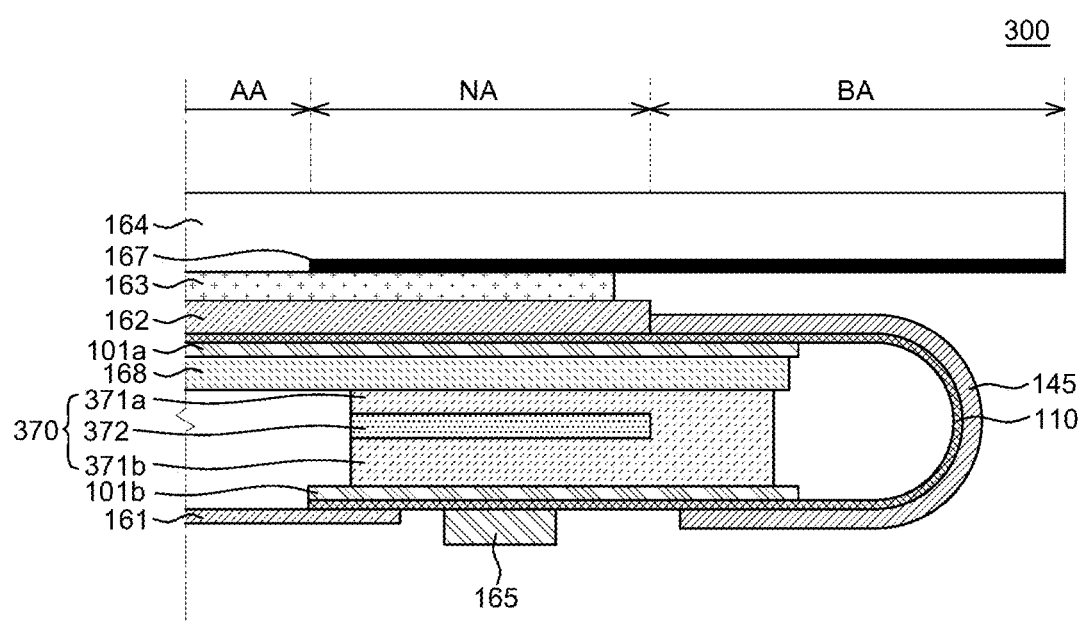
FIG. 8 is a cross-sectional view of a flexible display device according to a third exemplary embodiment of the present disclosure.

FIG. 8 is a cross-sectional view of a flexible display device according to a third exemplary embodiment of the present disclosure.

FIG. 8 illustrates a cross-section of a lower edge of the flexible display device 300 according to the third embodiment of the present disclosure as an example.

The flexible display device 300 according to the third embodiment of the present disclosure of FIG. 8 is substantially the same configuration as the flexible display device 100 according to the first embodiment of the present disclosure of FIG. 6 except for the configuration of the fixing tape 370. Therefore, the same reference numerals may be used for the same configuration, and detailed redundant description may be omitted.

Referring to FIG. 8, the flexible display device 300 of the third exemplary embodiment of the present disclosure may include a display panel 110, a polarizing plate 162, and a cover glass 164.

Substantially the same as in the flexible display device of the first embodiment of the present disclosure described above, the lower edge of the display panel 110 of the flexible display device 300 according to the third embodiment of the disclosure may be bent in a rear surface direction to have a predetermined curvature.

A polarizing plate 162 may be disposed on the barrier film.

A cover glass 164 may be disposed on the polarizing plate 162 through an adhesive layer 163.

A light shielding pattern 167 may be formed on four edges of the cover glass 164.

Back plate 101a and 101b may be disposed on the rear surface of the display panel 110.

At this time, the back plate 101a and 101b may be made of a first back plate 101a and the second back plate 101b located on each of the rear surface of the first flat portion and the second flat portion.

A cushion tape 168 may be disposed on the rear surface of the first back plate 101a.

The cushion tape 168 may be attached to the rear surface of the first back plate 101a using an adhesive. The cushion tape 168 may be disposed to be retracted a predetermined distance from the edge of the first back plate 101a. However, the present disclosure is not limited thereto.

A fixing tape 370 may be attached to the rear surface of the cushion tape 168. The fixing tape 370 may be integrated unlike the fixing tape in the flexible display devices of the first and second embodiments described above, but is not limited thereto.

The fixing tape 370 in the flexible display device according to the third embodiment of the present disclosure may be attached to the rear surface of the cushion tape 168. That is, it can be disposed between the cushion tape 168 and the second back plate 101b.

The fixing tape 370 may be disposed to be retracted a predetermined distance from the end of the cushion tape 168. However, the present disclosure is not limited thereto.

The fixing tape 370 may be disposed to be retracted a predetermined distance from both ends of the second back plate 101b, but is not limited thereto.

The fixing tape 370 in the flexible display device according to the third embodiment of the present disclosure may include a first adhesive layer 371a attached to the rear surface of the cushion tape 168, a second adhesive layer 371b attached to the upper surface of the second back plate 101b, and the electromagnetic wave absorbing layer 372 interposed between the first adhesive layer 371a and the second adhesive layer 371b.

The electromagnetic wave absorbing layer 372 may be interposed between the first adhesive layer 371a and the second adhesive layer 371b in the non-display area NA excluding the bending area BA. That is, the fixing tape 370 in the flexible display device according to the third embodiment of the present disclosure may be made of only the adhesive layers of the first adhesive layer 371a and the second adhesive layer 371b in the bending area BA.

In this way, the fixing tape 370 of the flexible display device 300 of the third embodiment of the present disclosure may be formed only of the adhesive layers of the first adhesive layer 371a and the second adhesive layer 371b in the bending area BA in order to suppress peeling in the bending area BA.

Meanwhile, a micro coating layer 145 may be disposed on the bending area BA of the display panel 110. The micro coating layer 145 may be formed to cover one side of the barrier film. However, the present disclosure is not limited thereto, and the micro coating layer 145 may be extended to cover one side and a portion of the upper surface of the polarizing plate 162. Further, the micro coating layer 145 may be further extended to the side of the adhesive layer 163.

The circuit element 161 may be connected to the end of the second flat portion of the display panel 110.

Various wirings for transmitting signals to the pixels disposed in the display area AA may be formed on the circuit element 161.

A driving IC 165 may be mounted on the second flat portion of the display panel 110 and connected to a wiring formed on the circuit element 161 to provide driving signals and data to sub-pixels disposed in the display area AA.

Meanwhile, as described above, the present disclosure may be applied to the bezel bending display device 400 having a curvature, in which the entire curved portion has a curvature and bent in a downward direction, which will be described in detail through a fourth embodiment of the present disclosure.

Figure 9:
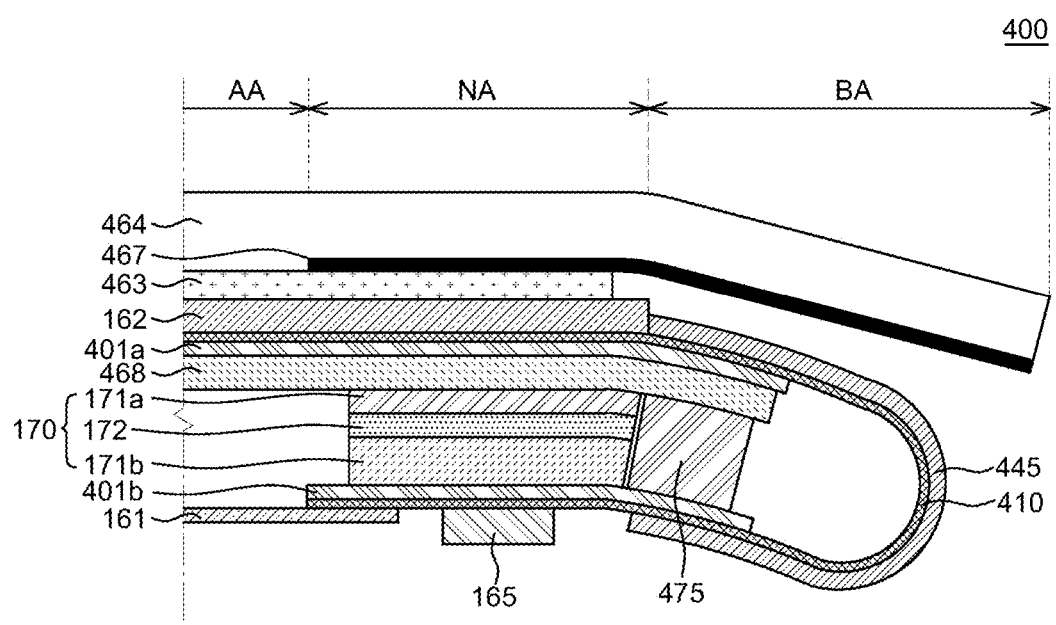
FIG. 9 is a cross-sectional view of a flexible display device according to a fourth exemplary embodiment of the present disclosure.

FIG. 9 is a cross-sectional view of a flexible display device according to a fourth exemplary embodiment of the present disclosure.

FIG. 9 illustrates a cross-section of a lower edge of the flexible display device 400 according to the fourth exemplary embodiment of the present disclosure.

The flexible display device 400 of the fourth embodiment of the present disclosure of FIG. 9 has substantially the same configuration as the flexible display device 100 of the first embodiment of the present disclosure of FIG. 6, except that the curved portion, that is, the entire bending area BA has a curvature and is bent downward. Therefore, the same reference numerals may be used for the same configuration, and detailed redundant description will be omitted.

Referring to FIG. 9, the flexible display device 400 according to the fourth exemplary embodiment of the present disclosure may include a display panel 410, a polarizing plate 162, and a cover glass 464.

The display panel 410 may include a first flat portion, a second flat portion, and a curved portion positioned between the first flat portion and the second flat portion. The first flat portion corresponds to the display area AA having a plurality of sub-pixels and a portion of the non-display area NA, and is an area that maintains a flat state.

The second flat portion is an area facing the first flat portion, corresponds to a pad portion having pads joined to the circuit element 161, and is a region maintaining a flat state.

Substantially the same as in the first embodiment of the present disclosure described above, the lower edge of the display panel 110 of the flexible display device 400 according to the fourth embodiment of the disclosure may be bent in a rear surface direction to have a predetermined curvature.

Meanwhile, the curved portion is a bending area BA that maintains a bent state at a predetermined curvature.

At this time, for example, the bending area BA may have a "⊃" shape. That is, the curved portion may extend from the first flat portion and bend 180 degrees to the rear side, and accordingly, the second flat portion extended from the curved portion can be positioned to overlap the first flat portion at the rear surface of the first flat portion. Accordingly, the circuit element 161 bonded to the display panel 410 in the second flat portion may be positioned in a rear direction of the display panel 110 in the first flat portion.

In addition, the bending area BA of the flexible display device of the fourth embodiment of the present disclosure may have a "⊃" shape and bent downward in a bent state.

That is, the curved portion extends from the first flat portion and is bent 180° in the rear direction to have a "⊃" shape, and the entire curved portion of the "⊃" shape has a curvature and may be bent downward.

A polarizing plate 162 may be disposed on the barrier film.

A cover glass 464 may be disposed on the polarizing plate 162 through an adhesive layer 463.

A light shielding pattern 467 may be formed on four edges of the cover glass 464.

Back plate 401a and 401b may be disposed on the rear surface of the display panel 410.

In this case, the back plate 401a and 401b may be made of a first back plate 401a and a second back plate 401b positioned on the rear surfaces of the first flat portion and the second flat portion, respectively.

A cushion tape 468 may be disposed on the rear surface of the first back plate 401a.

The cushion tape 468 may be attached to the rear surface of the first back plate 401a using an adhesive. The cushion tape 468 may be disposed to be retracted a predetermined distance from the edge of the first back plate 401a. However, the present disclosure is not limited thereto.

Fixing tape 170 and 475 may be attached to the rear surface of the cushion tape 468. The fixing tape 170 and 475 may be separated into two at the boundary between the non-display area NA and the bending area BA. However, the present disclosure is not limited thereto. Further, the fixing tape 170 and 475 may be integrally configured as in the above-described third embodiment.

For example, the fixing tape 170 and 475 of the flexible display device according to the fourth embodiment of the present disclosure may include the first fixing tape 170 attached to the rear surface of the cushion tape 468 in the non-display area NA and the second fixing tape 475 attached to the rear surface of the cushion tape 468 of the bending area BA. However, the present disclosure is not limited thereto.

The first fixing tape 170 and the second fixing tape 475 may be separated from each other at the boundary between the non-display area NA and the bending area BA. However, the present disclosure is not limited thereto.

The first fixing tape 170 and the second fixing tape 475 may have the same thickness. However, the present disclosure is not limited thereto.

The first fixing tape 170 may be disposed between the cushion tape 468 in the non-display area NA and the second back plate 401b. In addition, the second fixing tape 475 may be disposed between the cushion tape 468 of the bending area BA and the second back plate 401b.

The first fixing tape 170 may be disposed such that the edges thereof coincide with the upper polarizing plate 162. However, the present disclosure is not limited thereto.

The first fixing tape 170 may include a first adhesive layer 171a attached to the rear surface of the cushion tape 468, a second adhesive layer 171b attached to the upper surface of the second back plate 401b, and an electromagnetic wave absorbing layer 172 interposed between the first adhesive layer 171a and the second adhesive layer 171b. On the other hand, the second fixing tape 475 may be made of only an adhesive layer.

Meanwhile, a micro coating layer 445 may be disposed on the bending area BA of the display panel 410. The micro coating layer 445 may be formed to cover one side of the barrier film. However, the present disclosure is not limited thereto, and the micro coating layer 445 may be extended to cover one side and a portion of the upper surface of the polarizing plate 162. Further, the micro coating layer 445 may be further extended to the side surface of the adhesive layer 463.

The circuit element 161 may be connected to the edge of the second flat portion of the display panel 410.

Various wirings for transmitting signals to the pixels disposed in the display area AA may be formed on the circuit element 161.

A driving IC 165 may be mounted on the second flat portion of the display panel 410 and connected to the wiring formed on the circuit element 161 so as to provide driving signals and data to the sub-pixels disposed in the display area AA.

The flexible display device 400 according to the fourth embodiment of the present disclosure is characterized in that the entire bending area BA, that is, for example, the display panel 410, the cover glass 464, the first and second back plates 401a and 401b, the micro coating layer 445, the cushion tape 468 and the second fixing tape 475, has a curvature and is bent downward.

The entire display panel 410, the cover glass 464, the first and second back plates 401a and 401b, the micro coating layer 445, the cushion tape 468, and the second fixing tape 475 may have the same curvature and these can be bent downward. However, the present disclosure is not limited thereto. Some of the elements among the display panel 410, the cover glass 464, the first and second back plates 401a and 401b, the micro coating layer 445, the cushion tape 468, and the second fixing tape 475 may have different curvature and may be bent. In addition, each of the display panel 410, the cover glass 464, the first and second back plates 401a and 401b, the micro coating layer 445, the cushion tape 468, and the second fixing tape 475 may have various curvature and may be bent.

The exemplary embodiments of the present disclosure can also be described as follows:

A flexible display device according to an embodiment of the present disclosure may include a display panel, including a display area, a non-display area and a bending area, bent in a rear direction so that one edge of the display panel has a predetermined curvature, a first back plate and a second back plate, disposed on a rear surface of the display panel, a cushion tape disposed on a rear surface of the first back plate, and a fixing tape, disposed between the cushion tape and the second back plate, made of an adhesive layer in the bending area.

The flexible display device may further comprise a polarizing plate disposed over the display panel.

The display panel may include a first flat portion, a second flat portion facing the first flat portion, and a curved portion, extended from the first flat portion and bent in a rear surface direction, disposed between the first flat portion and the second flat portion, and wherein the first back plate and the second back plate are respectively disposed at rear surfaces of the first flat portion and the second flat portion.

The fixing tape may include a first fixing tape attached to a rear surface of the cushion tape in the non-display area and a second fixing tape attached to a rear surface of the cushion tape in the bending area.

The first fixing tape and the second fixing tape may be separated from each other at a boundary between the non-display area and the bending area.

The first fixing tape and the second fixing tape may have the same thickness.

The first fixing tape may be disposed between the cushion tape in the non-display area and the second back plate, and wherein the second fixing tape may be disposed between the cushion tape in the bending area and the second back plate.

An edge of the first fixing tape may be aligned with an edge of the polarizing plate.

The first fixing tape may include a first adhesive layer attached to the rear surface of the cushion tape, a second adhesive layer attached to an upper surface of the second back plate, and an electromagnetic wave absorbing layer disposed between the first adhesive layer and the second adhesive layer, and wherein the second fixing tape may be made of only an adhesive layer.

The flexible display device may further comprise a micro coating layer disposed in the bending area of the display panel.

The micro coating layer may be extended to cover a side and a portion of an upper surface of the polarizing plate.

In the non-display area, the fixing tape may include a first adhesive layer attached to a rear surface of the cushion tape, a second adhesive layer attached to an upper surface of the second back plate, and an electromagnetic wave absorbing layer disposed between the first adhesive layer and the second adhesive layer.

The electromagnetic wave absorbing layer may be disposed between the first adhesive layer and the second adhesive layer in the non-display area except for the bending area.

The display panel, the first and second back plates, the cushion tape, and the fixing tape in the bending area may have a curvature and may be bent downward.

It will be apparent to those skilled in the art that various modifications and variations can be made in the flexible display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A flexible display device, comprising:
    a cover glass;
    a light shielding pattern on a lower surface of the cover glass;
    a display panel under the cover glass and including a display area and a bending area;
    a plurality of touch sensors disposed at a position corresponding to the display area of the display panel below the cover glass;
    an adhesive layer between the cover glass and the display panel;
    a micro coating layer on an upper surface of the display panel in the bending area;
    a first back plate on a rear surface of the display panel in the display area; and
    a second back plate.

2. The flexible display device of claim 1, further comprising a polarizing plate between the adhesive layer and the display panel.

3. The flexible display device of claim 2, wherein the polarizing plate overlaps the light shielding pattern.

4. The flexible display device of claim 2, further comprising a cushion tape on a rear surface of the first back plate.

5. The flexible display device of claim 4, further comprising a fixing tape between the cushion tape and the second back plate.

6. The flexible display device of claim 5, wherein:
    the display panel further includes a first non-display area between the display area and the bending area; and the fixing tape includes:
- a first fixing tape attached to a rear surface of the cushion tape in the first non-display area; and
- a second fixing tape attached to the rear surface of the cushion tape in the bending area.

7. The flexible display device of claim 5, wherein the fixing tape overlaps the light shielding pattern.

8. The flexible display device of claim 5, wherein the fixing tape includes an adhesive layer contacting a rear surface of the cushion tape and the second back plate.

9. The flexible display device of claim 8, wherein a lateral end portion of the cushion tape does not coincide with a lateral end portion of the fixing tape and extends farther than the laternal end portion of the fixing tape, and
- wherein a lateral end portion of the second back plate does not coincide with the lateral end portion of the fixing tape and extends farther than the lateral end portion of the fixing tape.

10. The flexible display device of claim 1, further comprising a driving IC,
- wherein the display panel further includes a second non-display area extending from the bending area, and the driving IC is mounted on the upper surface of the display panel in the second non-display area.

11. The flexible display device of claim 10, wherein the driving IC overlaps the light shielding pattern.

12. The flexible display device of claim 1, further comprising:
- a thin film transistor in the display panel in the display area; and
- a planarization layer over the thin film transistor.

13. The flexible display device of claim 12, further comprising an intermediate electrode on a first planarization layer of the planarization layer and electrically connected to the thin film transistor.

14. The flexible display device of claim 13, further comprising a light emitting element over a second planarization layer of the planarization layer and electrically connected to the intermediate electrode.

15. The flexible display device of claim 14, wherein the light emitting element includes an anode, a light emitting unit, and a cathode.

16. The flexible display device of claim 15, further comprising a bank on the anode and the second planarization layer,
- wherein the bank covers a lateral end portion of the anode.

17. The flexible display device of claim 16, further comprising a spacer on the bank.

18. The flexible display device of claim 1, wherein the light shielding pattern overlaps a portion of the micro coating layer, a portion of the first back plate, and a portion of the second back plate.

19. The flexible display device of claim 2, further comprising a touch screen panel including the plurality of touch sensors is provided on the display panel.

20. The flexible display device of claim 19, wherein:
- the polarizing plate is located on a top of the touch screen panel; and
- the cover glass is provided to cover at least a part of the touch screen panel.

21. The flexible display device of claim 6, wherein an edge of first fixing tape and an edge of the polarizing plate disposed on the first fixing tape are aligned with each other.

22. The flexible display device of claim 2, wherein the micro coating layer is extended to cover a portion of side and top surfaces of the polarizing plate.

23. The flexible display device of claim 2, wherein a part where the polarizing plate and the micro coating layer face each other overlaps with the light shielding pattern.

24. The flexible display device of claim 2, wherein the polarizing plate and the micro coating layer are in contact with each other.

* * * * *